(12) United States Patent
Chen et al.

(10) Patent No.: US 9,548,216 B1
(45) Date of Patent: Jan. 17, 2017

(54) METHOD OF ADJUSTING CHANNEL WIDTHS OF SEMICONDUCTIVE DEVICES

(71) Applicant: UNITED MICROELECTRONICS CORP., Hsin-Chu (TW)

(72) Inventors: Yu-Te Chen, Tainan (TW); Chia-Hsun Tseng, Tainan (TW); En-Chiuan Liou, Tainan (TW); Chiung-Lin Hsu, Tainan (TW); Meng-Lin Tsai, Tainan (TW); Jan-Fu Yang, Tainan (TW); Yu-Ting Hung, Hsinchu (TW); Shin-Feng Su, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/809,270

(22) Filed: Jul. 26, 2015

(51) Int. Cl.
| | |
|---|---|
| *H01L 21/76* | (2006.01) |
| *H01L 21/321* | (2006.01) |
| *H01L 21/225* | (2006.01) |
| *H01L 21/3205* | (2006.01) |
| *H01L 21/3105* | (2006.01) |

(52) U.S. Cl.
CPC ......... *H01L 21/321* (2013.01); *H01L 21/2253* (2013.01); *H01L 21/3105* (2013.01); *H01L 21/32055* (2013.01)

(58) Field of Classification Search
None
See application file for complete search history.

(56) References Cited

U.S. PATENT DOCUMENTS

| | | | |
|---|---|---|---|
| 7,326,634 B2 | 2/2008 | Lindert | |
| 7,329,913 B2 | 2/2008 | Brask | |
| 8,389,391 B2 | 3/2013 | Chambers | |
| 2007/0120156 A1 | 5/2007 | Liu | |
| 2008/0224258 A1 | 9/2008 | Schepis | |
| 2011/0133292 A1* | 6/2011 | Lee | H01L 21/82343 257/401 |
| 2013/0099282 A1 | 4/2013 | Chen | |
| 2013/0140637 A1 | 6/2013 | Chang | |
| 2013/0256799 A1 | 10/2013 | Wu | |
| 2014/0027860 A1 | 1/2014 | Glass | |
| 2014/0151766 A1 | 6/2014 | Eneman | |
| 2014/0264488 A1* | 9/2014 | Fronheiser | H01L 29/66795 257/288 |
| 2014/0284723 A1* | 9/2014 | Lee | H01L 21/76 257/369 |
| 2016/0196975 A1* | 7/2016 | Tao | H01L 21/2253 438/703 |

\* cited by examiner

*Primary Examiner* — Shaun Campbell
(74) *Attorney, Agent, or Firm* — Winston Hsu; Scott Margo

(57) ABSTRACT

A method of adjusting channel widths of semiconductive devices includes providing a substrate divided into a first region and a second region, wherein the substrate comprises numerous fins. A first implantation process is performed on the fins within the first region. Then, a second implantation process is performed on the fins within the second region, wherein the first implantation process and the second implantation process are different from each other in at least one of the conditions comprising dopant species, dopant dosage or implantation energy. After that, part of the fins within the first region and the second region are removed simultaneously to form a plurality of first recesses within the first region and a plurality of second recesses within the second region. Finally, a first epitaxial layer and a second epitaxial layer are formed to fill up each first recess and each second recess, respectively.

12 Claims, 6 Drawing Sheets

METHOD OF ADJUSTING CHANNEL WIDTHS OF SEMICONDUCTIVE DEVICES

BACKGROUND OF THE INVENTION

1. Field of the Invention

The present invention relates to a method of adjusting channel widths of semiconductive devices, and more particularly, to a method of adjusting channel widths by adjusting the thicknesses of epitaxial layers within different regions.

2. Description of the Prior Art

In the semiconductor industry, there is a constant demand for increased operating speed of integrated circuits (ICs). This demand has, in turn, resulted in a continual reduction in size of the semiconductor devices. Specifically, the channel length, junction depths, and/or gate dielectric thickness of field effect transistors (FETs) are reduced to provide a compact semiconductor structure.

Channel width of a FET or FinFET may affect the total amount of electronic current that the FET or FinFET is able to provide during an operation. Manufacturing of FETs or FinFETs to certain desirable channel widths is often required, wherein the FETs/FinFETs are sometimes on a single chip and sometimes placed next to each other in a densely populated area, in order to fulfill particular performance targets of the devices.

Therefore, a novel method of adjusting channel width to achieve desirable channel width is needed.

SUMMARY OF THE INVENTION

According to a preferred embodiment of the present invention, a method of adjusting channel widths of semiconductive devices includes providing a substrate divided into a first region and a second region, wherein the substrate comprises a plurality of fins disposed within the first region and the second region and an isolating region disposed between adjacent fins. Later, a first implantation process is performed on the fins within the first region. Then, a second implantation process is performed on the fins within the second region, wherein the first implantation process and the second implantation process are different in at least one of the conditions comprising dopant species, dopant dosage or implantation energy. Part of the fins within the first region and the second region are removed simultaneously to form a plurality of first recesses within the first region and a plurality of second recesses within the second region. Finally, a first epitaxial layer and a second epitaxial layer are simultaneously formed to fill up each first recess and each second recess, respectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
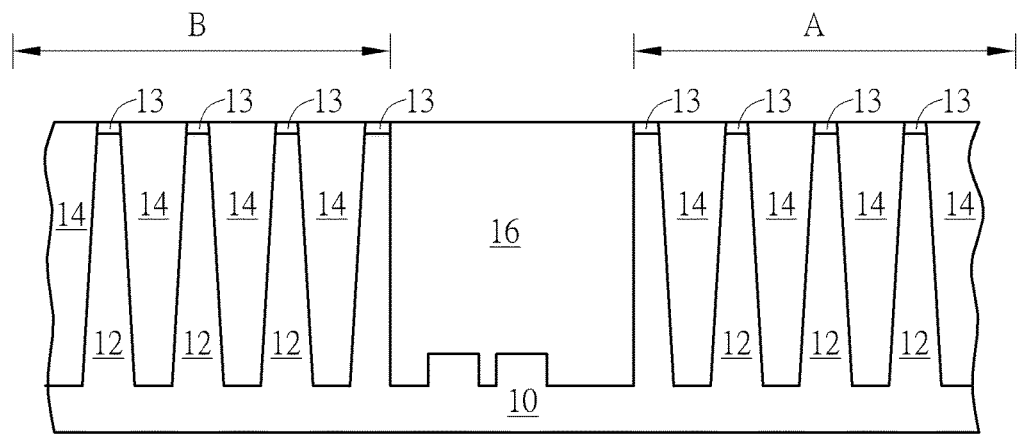
FIG. 1 to FIG. 10 depict a method of adjusting channel widths of semiconductive devices schematically.

FIG. 1 to FIG. 9 depict a method of adjusting channel widths of semiconductive devices schematically. As shown in FIG. 1, a substrate 10 is provided. The substrate 10 of the present invention may be a bulk silicon substrate, a germanium substrate, a gallium arsenide substrate, a silicon germanium substrate, an indium phosphide substrate, a gallium nitride substrate or a silicon carbide substrate. The substrate 10 is divided into a first region A and a second region B. The first region A can be a PMOS region or an NMOS region. The second region B can be an NMOS region or a PMOS region. The first region A can be the same conductive type as the second region B or different conductive type from the second region B. The substrate 10 includes numerous fins 12 disposed within the first region A and the second region B. Each fin 12 can optionally be covered by a cap layer 13. Based on different requirements, the cap layer 13 can be omitted. An isolating region 14 such as an STI is disposed between adjacent fins 12. The isolating region 14 is preferably made of silicon oxide. A liner (not shown) surrounds each isolating region 14. Another isolating region 16 is embedded within the substrate 10 between the first region A and the second region B. A top surface of the cap layer 13 within the first region A and within the second region B is aligned with a top surface of the isolating region 14. If the cap layer 13 is omitted, top surfaces of fins 12 within the first region A and within the second region B are aligned with a top surface of the isolating region 14.

Figure 2:
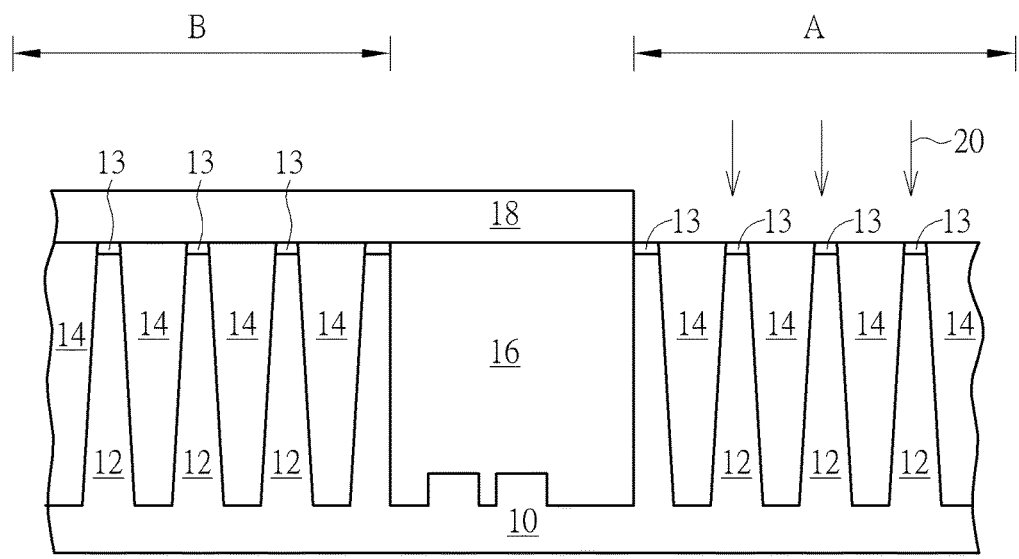

As shown in FIG. 2, a mask layer 18 is formed to cover the second region B, and expose the first region A. A first implantation process 20 is performed on the fins 12 within the first region A. The first implantation process 20 is performed by implanting dopants into the fins 12 within the first region A. The dopant species, the dopant dosage and implantation energy of the dopants in the first implantation process 20 can be adjusted based on different requirements. Then, the mask layer 18 is removed. In the first implantation process 20, the species of the dopants refers to types of the dopants, or elements of the dopants. For example, the dopant species in the first implantation process 20 can be n-type, and the elements of the dopants can be phosphorus or arsenic. In another embodiment, the dopant species in the first implantation process 20 can be p-type, and the elements of the dopants can be boron.

Figure 3:
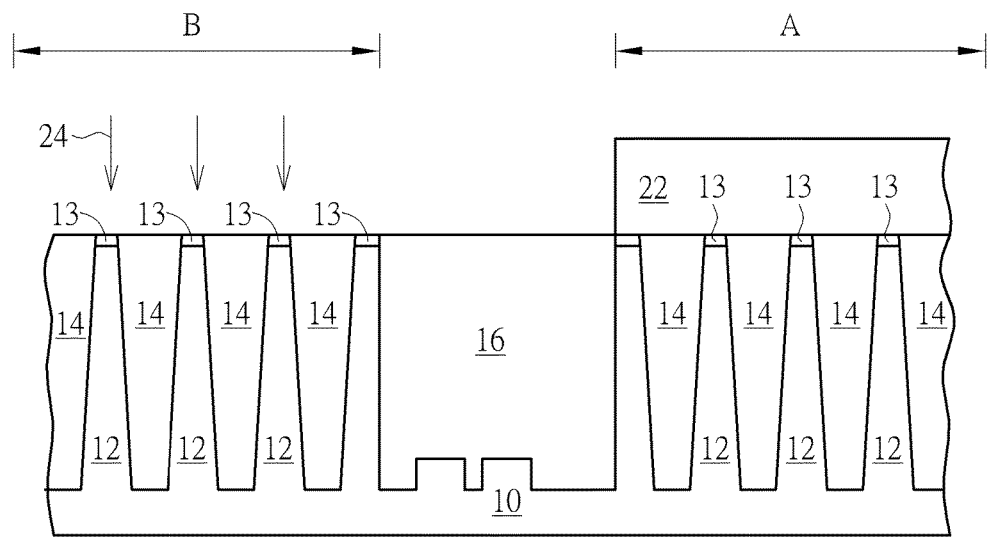

Please refer to FIG. 3. A mask layer 22 is formed to cover the first region A and expose the second region B. Later, a second implantation process 24 is performed on the fins 12 within the second region B. The second implantation process 24 is performed by implanting dopants into the fins 12 within the second region B. In the second implantation process 24, the species of the dopants, the dopant dosage and implantation energy of the dopants can be adjusted based on different requirements. Then, the mask layer 22 is removed. The species of the dopants refers to types of the dopants, or elements of the dopants. For example, the dopant species in the second implantation process 24 can be p-type, and the elements of the dopants can be boron. In other example, the dopant species in the second implantation process 24 can be n-type, and the elements of the dopants can be phosphorus or arsenic.

It is noteworthy that the first implantation process 20 and the second implantation process 24 are different in at least one of the implanting conditions comprising dopant species, dopant dosage or implantation energy. For example, dopant species in the first implantation process 20 can be n-type dopants, and dopant species in the second implantation process 24 can be p-type dopants. The dopant dosage of the n-type dopants and the p-type dopants can be the same, and the implantation energy of the n-type dopants and the p-type dopants can be the same also. In another example, the first implantation process 20 and the second implantation process 24 have two different implanting conditions such as dopant dosage and implantation energy; however, the dopant species of first implantation process 20 and the second implantation process 24 can be the same. For instance, the dopant species of first implantation process 20 and the second implantation process 24 can both be xenon.

Because the implanting conditions of the first implantation process 20 and the second implantation process 24 are different, the fins 12 within the first region A and the second region B suffer different levels of damage during the first implantation process 20 and the second implantation process 24. Different damaged levels of the fins 12 will make the fins 12 within the first region A and the second region B have different etch rates against the same etching condition.

In another embodiment, the first implantation process 20 and the second implantation process 24 can be replaced by other treatments such as laser anneal. The temperatures, the anneal times, and the laser energy of the first region A and of the second region B can be independently determined.

In yet another embodiment, one of the implantation process 20 and the second implantation process 24 can be omitted. That is, only one of the first region A and the second region B will receive the implantation, and fins in the region which receives the implantation will be damaged. Fins 12 within the first region A and the second region B can therefore have different levels of damage.

Figure 4:
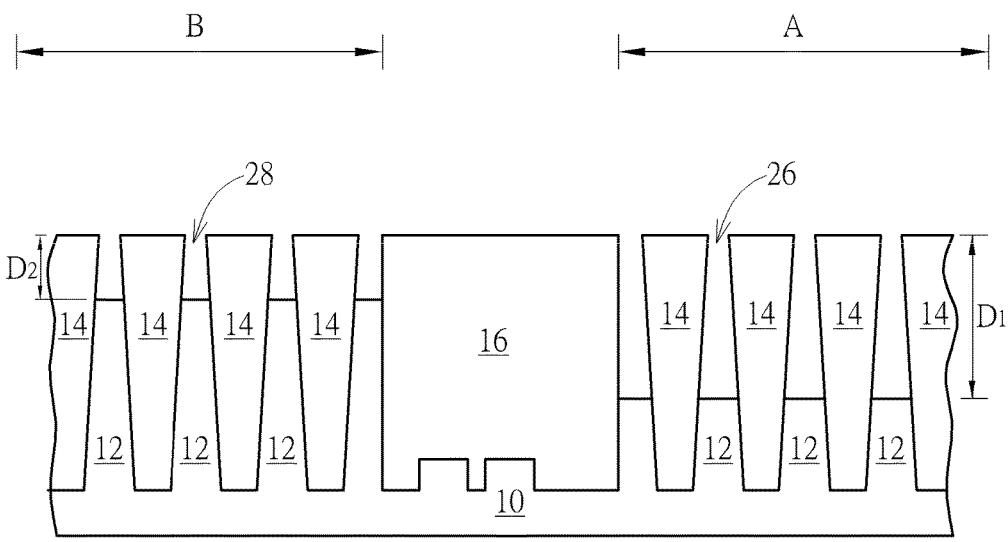

As shown in FIG. 4, the damaged portions of fins 12 in the first region A and the second region B are removed simultaneously by an etching process to form numerous first recesses 26 within the first region A and numerous second recesses 28 within the second region B. The depth $D_1$ of the first recess 26 is greater than the depth $D_2$ of the second recess 28. Each first recess 26 and second recess 28 is sandwiched between two adjacent isolation regions 14. The etching process can be a dry etching or a wet etching process. The damaged portions of fins 12 in the first region A and the second region B can be removed entirely or partly. If the damaged portions of fins 12 are removed partly, there will be a damaged portion which remains on each fin 12.

Figure 5:
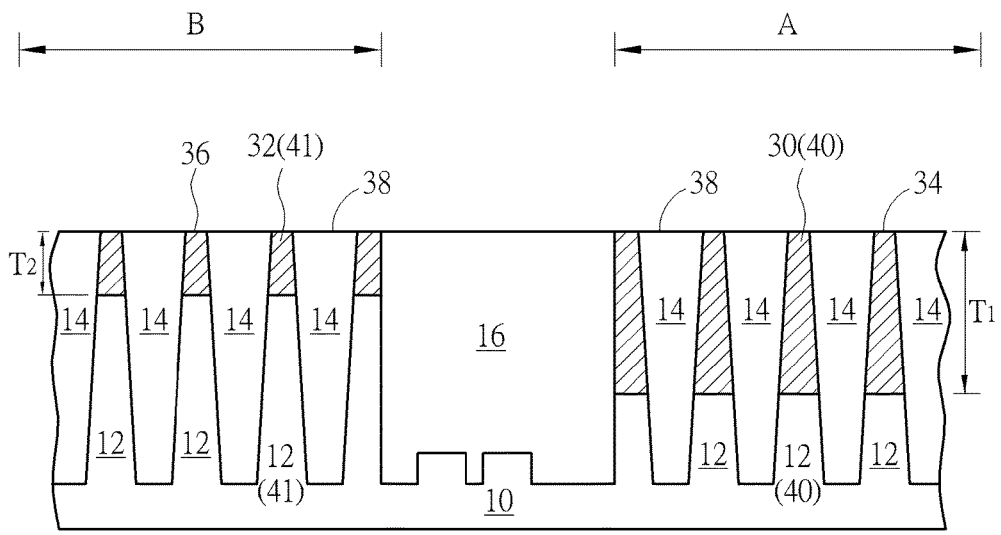

As shown in FIG. 5, a first epitaxial layer 30 is formed to fill up each first recess 26 and a second epitaxial layer 32 is formed to fill up each second recess 28 simultaneously. The first epitaxial layer 30 and the second epitaxial layer 32 may be SiGe, SiC, SiP or SiCP. The first epitaxial layer 30 and the second epitaxial layer 32 comprise the same material. For example, the first epitaxial layer 30 may be SiGe and the second epitaxial layer 32 may also be SiGe. Furthermore, the first epitaxial layer 30 and the second epitaxial layer 32 may induce the same type stress. For instance, the first epitaxial layer 30 and the second epitaxial layer 32 can both induce a compressive stress in a channel of a FET formed afterwards. On the other hand, the first epitaxial layer 30 and the second epitaxial layer 32 can both induce a tensile stress in a channel of a FET formed afterwards. A thickness $T_1$ of the first epitaxial layer 30 is greater than a thickness $T_2$ of the second epitaxial layer 32. The first epitaxial layer 30 and the second epitaxial layer 32 can be formed by an epitaxial growth process. If there is some damaged portion remaining on each fin 12, the thickness of the damaged portion in the first region A and the second region can influence the growing speed of the first epitaxial layer 30 and the second epitaxial layer 32. Therefore, by controlling the damaged portion which remains on each fin 12, different thicknesses $T_1/T_2$ can be formed simultaneously within the epitaxial growth process. If no damaged portion is left, the different thicknesses $T_1/T_2$ can be formed by an epitaxial growth process followed by an etching back process.

At this point, a top surface 34 of the first epitaxial layer 30 and a top surface 36 of the second epitaxial layer 32 are both aligned with a top surface 38 of the isolating region 14. The first epitaxial layer 30 and the remaining fin 12 contacting the first epitaxial layer 30 constitute a first fin structure 40. The second epitaxial layer 32 and the remaining fin 12 contacting the second epitaxial layer 32 constitute a second fin structure 41.

Figure 6:
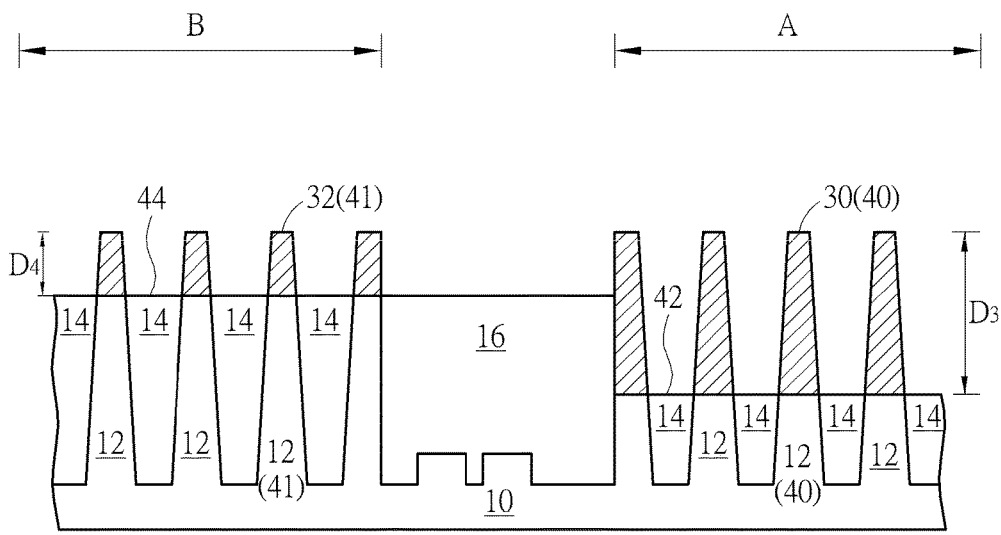

As shown in FIG. 6, the isolating region 14 within the first region A and within the second region B is etched independently. For example, a depth $D_3$ of the isolating region 14 within the first region A can be etched while the isolating region 14 within the second region B is protected by a mask layer (not shown). Then, a depth $D_4$ of the isolating region 14 within the second region B can be etched while the isolating region 14 within the second region A is protected by a mask layer (not shown). Alternatively, the isolating region 14 within the second region B can be etched before the isolating region 14 within the first region A is etched. Because the isolating region 14 within the first region A and within the second region B is etched independently, the depth $D_3$ and the depth $D_4$ can be different or identical. In the embodiment in FIG. 6, the depth $D_3$ is greater than the depth $D_4$. Furthermore, after removing the isolating region 14 within the first region A, the entire first epitaxial layer 30 protrudes over a top surface 42 of the remaining isolating region 14 within the first region A. After removing the isolating region 14 within the second region B, the entire second epitaxial layer 32 protrudes over a top surface 44 of the remaining isolating region 14 within the second region B.

Figure 7:
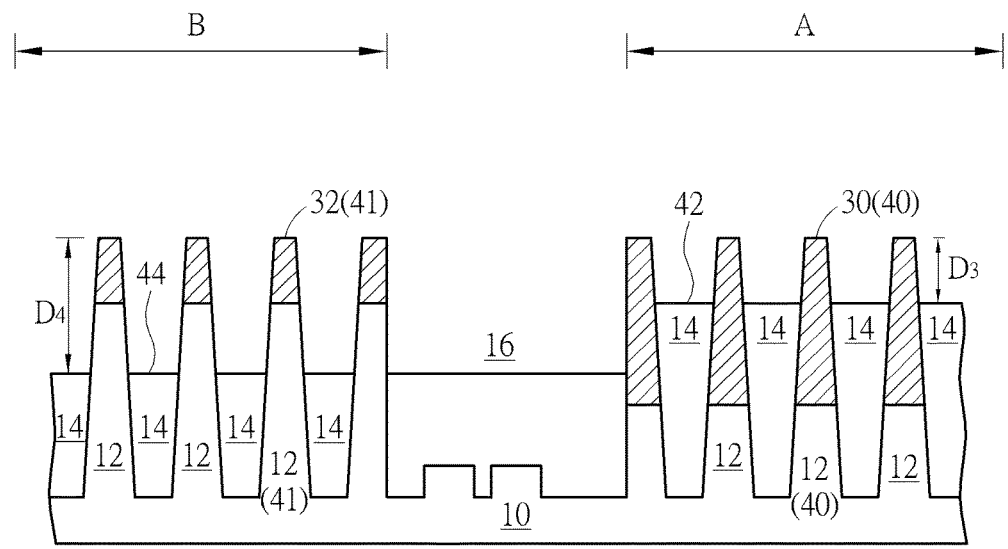

Since the isolating region 14 within the first region A and within the second region B is etched independently, the depth $D_3$ and the depth $D_4$ can be adjusted based on different requirements. By adjusting the depth $D_3$ and the depth $D_4$, only part of the first epitaxial layer 30 may protrude over the top surface 42 of the remaining isolating region 14 within the first region A, or only part of the second epitaxial layer 32 may protrude over the top surface 44 of the remaining isolating region 14 within the second region B. Moreover, by adjusting the depth $D_3$ and the depth $D_4$, even part of the fins 12 may protrude over the top surface 42 in the first region A or part of the fins 12 may protrude over the top surface 44 of the remaining isolating region 14 within the second region B. As shown in FIG. 7, the depth $D_3$ is smaller than the depth $D_4$. Furthermore, only part of the first epitaxial layer 30 protrudes over the top surface 42 of the remaining isolating region 14 within the first region A, while the entire second epitaxial layer 32 protrudes over the top surface 44 of the remaining isolating region 14 within the second region B and part of the fins 12 within the second region B protrude over the top surface 44 of the remaining isolating region 14.

Figure 8:
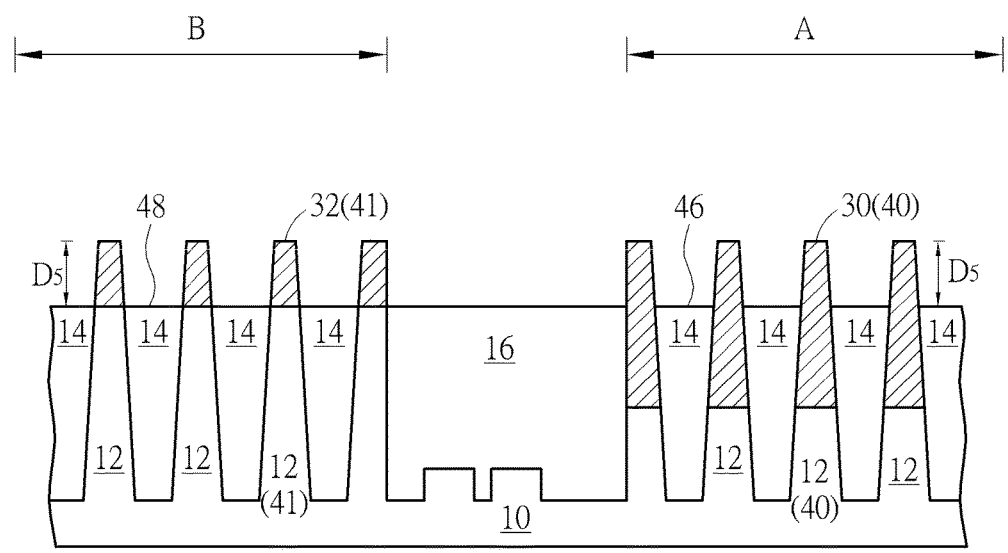
Figure 9:
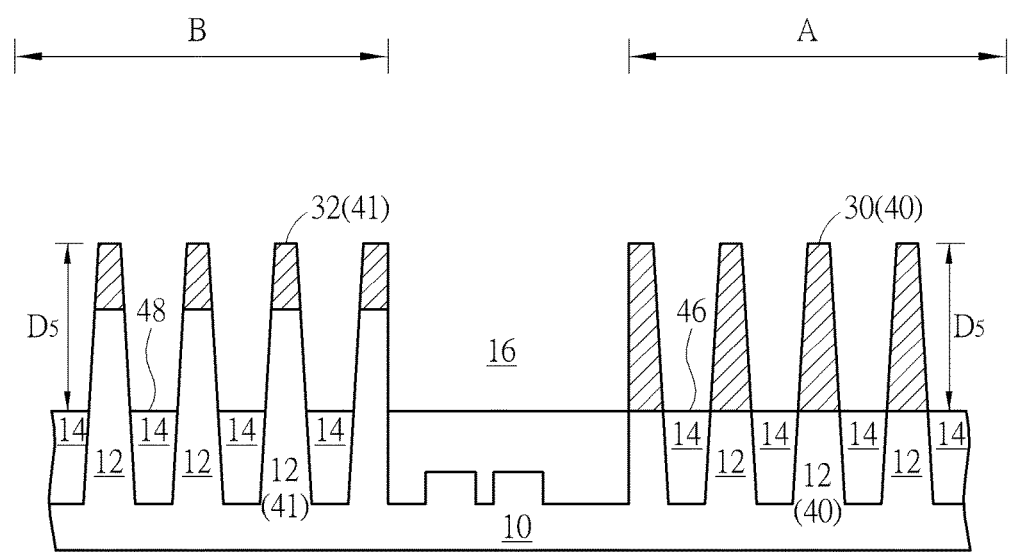

According to anther embodiment of the present invention, the isolating region 14 within the first region A and within the second region B is etched simultaneously. Please refer to FIG. 8. Because the isolating region 14 within the first region A and within the second region B is etched simultaneously, the isolating region 14 within the first region A and within the second region B is removed to the same depth $D_5$. In other words, after the isolating region 14 is etched, a top surface 46 of the isolating region 14 within the first region A is aligned with a top surface 48 of the isolating region 14 within the second region B. The depth can be many values such that the protruding part is the first epitaxial layer 30, the second epitaxial layer 32, the fin 12 within the first region A or the fin 12 within the second region B. FIG. 8 and FIG. 9 exemplify the relative positions of the first epitaxial layer 30, the second epitaxial layer 32, the fin 12 and the isolating region 14 as examples; however, as long as the isolating region 14 within the first region A and within the second region B is removed simultaneously, there may be other possible relative positions of the first epitaxial layer 30, the second epitaxial layer 32, the fin 12 and the isolating region 14, and these also belong to the field of the present invention. Still referring to FIG. 8, after the isolating region 14 within the first region A and within the second region B is etched simultaneously, the entire second epitaxial layer 32 protrudes over the top surface 48 of the remaining isolating region 14 within the second region B, and only part of the first epitaxial layer 30 protrudes over the top surface 46 of the remaining isolating region 14 within the first region A.

As shown in FIG. 9, after the isolating region 14 within the first region A and within the second region B is etched simultaneously, the entire first epitaxial layer 30 protrudes over the top surface 46 of the remaining isolating region 14 within the first region A, and the entire second epitaxial layer 32 protrudes over the top surface 48 of the remaining isolating region 14 within the second region B.

After the isolating region 14 within the first region A and within the second region B is etched, a gate structure is formed to cross the first epitaxial layer 30 and the second epitaxial layer 32 in FIG. 6, FIG. 7, FIG. 8 and FIG. 9. Then, the source/drain regions are formed in the first epitaxial layer 30 and the second epitaxial layer 32. Since FIG. 6, FIG. 7, FIG. 8 and FIG. 9 illustrate the same concept of forming the gate structure, only FIG. 6 is taken as an example to show the position of the gate structure.

Figure 10:
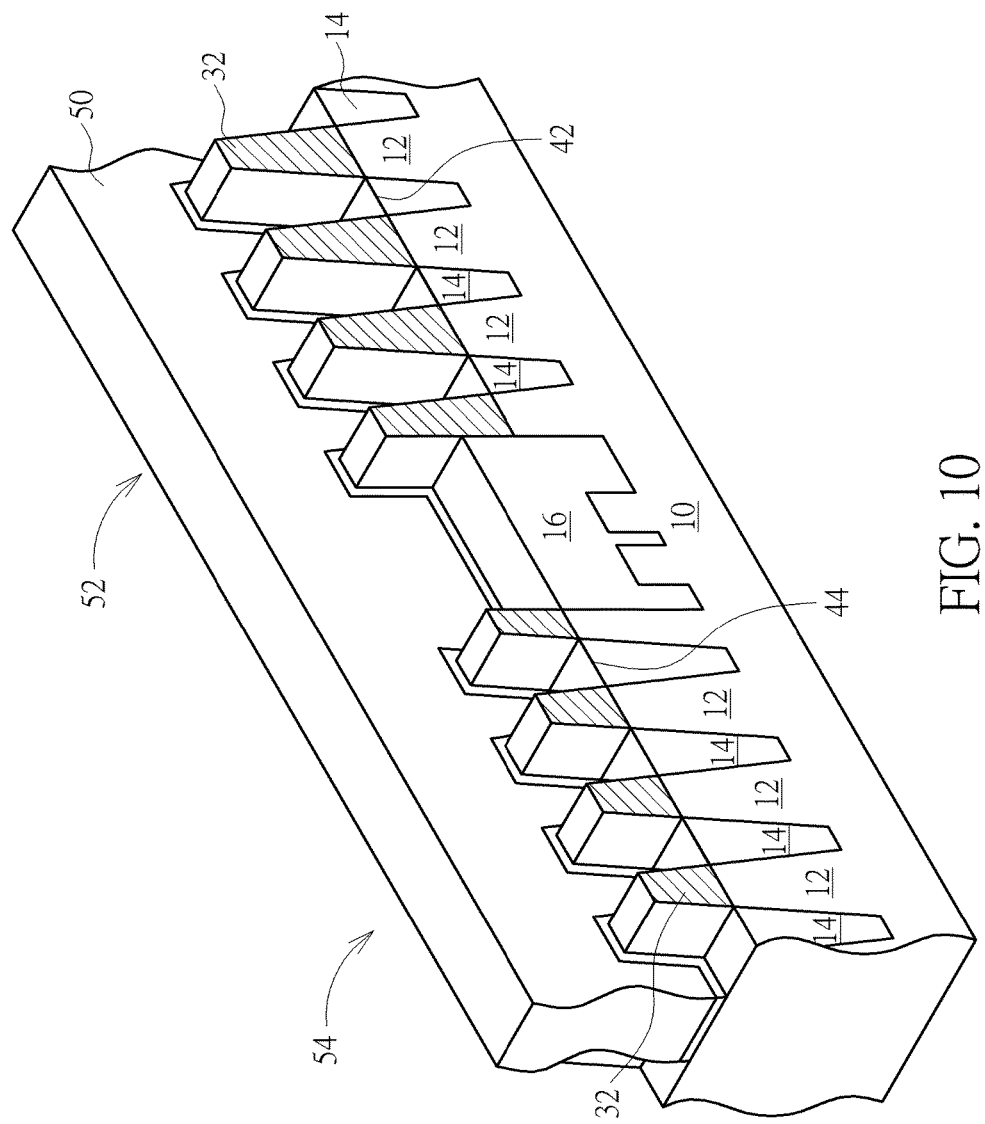

Continuing from the example shown in FIG. 6, as shown in FIG. 10, after the isolating region 14 within the first region A and within the second region B is etched, a gate structure 50 is formed to cross the first epitaxial layer 30 and the second epitaxial layer 32. Then, source/drain regions (not shown) are formed within the first epitaxial layer 30 and the second epitaxial layer 32 at two sides of the gate structure 50. The gate structure includes a gate electrode and a gate dielectric. At this point, two types of FinFETs 52/54 with different channel widths are completed. Because the thickness $T_1$ of the first epitaxial layer 30 is different from the thickness $T_2$ of the second epitaxial layer 32, the FinFET 52 using the first epitaxial layer 30 as a channel path has a different channel width from the FinFET 54 using the second epitaxial layer 32 as a channel path. The FinFET 52 and the FinFET 54 may be the same type of transistor or different types of transistors. The types of FinFET 52 and the FinFET 54 may be PMOS, NMOS, high-voltage FETs, high/normal/low frequency FETs, low/high power FETs, high, low, or regular threshold voltage transistors.

As well as being applied to FinFETs, the method of adjusting channel width of semiconductive devices illustrated above can also be applied to planar transistors.

Because different implanting conditions are used in the first implantation process 20 and in the second implantation process 24, the damage level of the fins 12 within the first region A and the second region B is different. Furthermore, by controlling the implanting conditions, the damage level of the fins 12 can be adjusted to a desirable degree. Therefore, the fins 12 within the first region A and within the second region B can be removed to desirable thicknesses respectively. After that, the first epitaxial layer 30 and the second epitaxial layer 32 are grown to replace the position of the fins 12 removed earlier. In this way, the first fin structure 40 and the second fin structure 41 will have epitaxial layers with desirable thicknesses. By using the first fin structure 40 or the second fin structure 41 to form field-effect transistors 52/54, the channel width of the field-effect transistors 52/54 can be customized to fulfill particular performance requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of adjusting channel widths of semiconductive devices, comprising:
   providing a substrate divided into a first region and a second region, wherein the substrate comprises a plurality of fins disposed within the first region and the second region and an isolating region disposed between adjacent fins;
   performing a first implantation process on the fins within the first region;
   performing a second implantation process on the fins within the second region, wherein the first implantation process and the second implantation process are different from each other in at least one of the conditions comprising dopant species, dopant dosage or implantation energy;
   simultaneously removing part of the fins within the first region and the second region to form a plurality of first recesses within the first region and a plurality of second recesses within the second region, wherein a depth of each of the first recesses is greater than a depth of each of the second recesses; and
   simultaneously forming a first epitaxial layer to fill up each first recess and forming a second epitaxial layer to fill up each second recess.

2. The method of adjusting channel widths of semiconductive devices of claim 1, wherein before removing the fins, a top surface of each fin within the first region and within the second region is aligned with a top surface of the isolating region.

3. The method of adjusting channel widths of semiconductive devices of claim 2, wherein a top surface of the first epitaxial layer and a top surface of the second epitaxial layer are both aligned with the top surface of the isolating region.

4. The method of adjusting channel widths of semiconductive devices of claim 1, further comprising:
   simultaneously removing a first depth of the isolating region within the first region and within the second region to make the first epitaxial layer and the second epitaxial layer protrude over a top surface of the remaining isolating region.

5. The method of adjusting channel widths of semiconductive devices of claim 4, wherein after removing the first depth of the isolating region, part of each fin within the first region protrudes over the top surface of the remaining isolating region.

6. The method of adjusting channel widths of semiconductive devices of claim 1, further comprising:
   removing a second depth of the isolating region within the first region to make the first epitaxial layer protrude over a top surface of the remaining isolating region within the first region; and
   removing a third depth of the isolating region within the second region to make the second epitaxial layer protrude over a top surface of the remaining isolating region within the second region, wherein the second depth is different from the third depth.

7. The method of adjusting channel widths of semiconductive devices of claim 6, wherein the entire first epitaxial layer protrudes over the top surface of the remaining isolating region within the first region, and the entire second epitaxial layer protrudes over the top surface of the remaining isolating region within the second region.

8. The method of adjusting channel widths of semiconductive devices of claim 6, wherein after removing the third depth of the isolating region, part of each fin within the second region protrudes over the top surface of the remaining isolating region.

9. The method of adjusting channel widths of semiconductive devices of claim 1, wherein a thickness of the first epitaxial layer is greater than a thickness of the second epitaxial layer.

10. The method of adjusting channel widths of semiconductive devices of claim 1, wherein the dopant species comprises p-type dopants or n-type dopants.

11. The method of adjusting channel widths of semiconductive devices of claim 1, wherein each of the first recesses is defined by the isolation region within the first region and the remaining fins adjacent to the isolation region within the first region.

12. The method of adjusting channel widths of semiconductive devices of claim 1, wherein each of the second recesses is defined by the isolation region within the second region and the remaining fins adjacent to the isolation region within the second region.

* * * * *